United States Patent [19]

Lambert

[11] 4,315,066
[45] Feb. 9, 1982

[54] SUBSTRATES SUITABLE FOR THE PRODUCTION OF PHOTOPOLYMERIZABLE ELEMENTS

[75] Inventor: Stuart G. Lambert, Colchester, England

[73] Assignee: Bexford Limited, London, England

[21] Appl. No.: 51,409

[22] Filed: Jun. 25, 1979

[30] Foreign Application Priority Data

Mar. 29, 1979 [GB] United Kingdom ............... 10062/79
Jun. 6, 1979 [GB] United Kingdom ............... 19769/79

[51] Int. Cl.$^3$ ............................................. G03C 1/78
[52] U.S. Cl. .................................. 430/271; 430/270; 430/281; 430/285; 428/480; 428/910
[58] Field of Search ............... 430/271, 270, 281, 285; 428/480, 910

[56] References Cited

U.S. PATENT DOCUMENTS

| | | | |
|---|---|---|---|
| 2,634,251 | 4/1953 | Kass | 260/45.4 |
| 3,865,789 | 2/1975 | Wybof | 260/47 C |
| 3,900,693 | 8/1975 | Wybof | 428/511 |
| 3,948,666 | 4/1976 | Kitanishi et al. | 430/271 |
| 3,983,301 | 9/1976 | Cook et al. | 428/480 |
| 4,060,656 | 11/1977 | Naka et al. | 430/271 |
| 4,175,156 | 11/1979 | Ikins | 428/480 |

FOREIGN PATENT DOCUMENTS 1321108  6/1973  United Kingdom .
1441181  6/1976  United Kingdom .
1507660  4/1978  United Kingdom .

Primary Examiner—Jack P. Brammer
Attorney, Agent, or Firm—Cushman, Darby & Cushman

[57] ABSTRACT

Substrates suitable for the production of photopolymerizable elements comprise an adhesive layer capable of providing durable adhesion between a photopolymerizable layer and a plastics film or sheet, wherein the adhesive layer comprises an unsaturated resin having the formula:

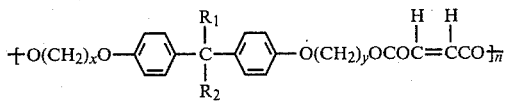

wherein $R_1$ and $R_2$ are the same or different and represent lower alkyl groups having up to 6 carbon atoms, x and y are the same or different and are an integer from 1 to 4 inclusive and n is an integer from 4 to 30 inclusive. The preferred resin is a propoxylated bisphenol A-fumarate condensate. Suitable for the production of photorelief printing plates.

8 Claims, 4 Drawing Figures

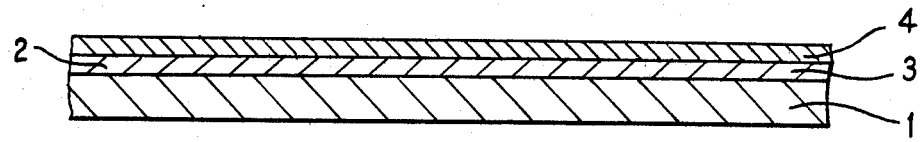
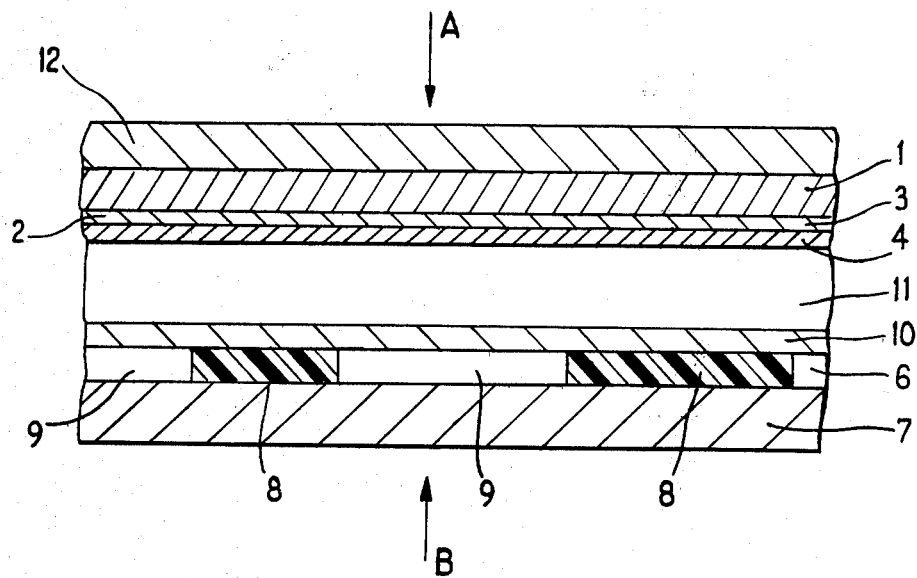

SUBSTRATES SUITABLE FOR THE PRODUCTION OF PHOTOPOLYMERIZABLE ELEMENTS

BACKGROUND AND SUMMARY OF THE INVENTION

The present invention relates to a substrate suitable for use in the production of photopolymerisable elements and to the photopolymerisable elements produced from the substrates.

Relief printing plates formed from photopolymerisable elements comprising a transparent thermoplastics film support are described in British patent specifications Nos. 1,321,108 and 1,507,660. Such printing plates are produced by exposing the photopolymerisable element comprising a photopolymerisable layer carried by the film support to actinic light through a master such as a photographic image. After the exposure step, the non-light-struck areas of the photopolymerisable layer are washed away by treatment with a suitable solvent to leave a photopolymerised relief printing pattern in the light-struck areas.

The adhesion of the relief printing pattern to the film support should ideally resist damage during repeated use, e.g. in rotary printing machines.

The present invention relates to a substrate suitable for use in the production of a photopolymerisable element comprising an adhesive layer which is capable of promoting tenacious adhesion between the film support and the photopolymerisable relief areas formed by exposing to light a photopolymerisable layer applied over the adhesive layer.

According to the present invention, a substrate suitable for the production of a photopolymerisable element, comprises a self-supporting plastics film or sheet having an adhesive layer superimposed upon at least one surface thereof, wherein the adhesive layer comprises an unsaturated resin having the formula:

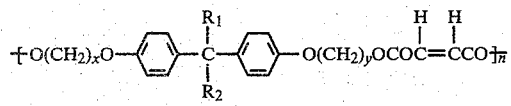

wherein $R_1$ and $R_2$ are the same or different and represent lower alkyl groups having up to 6 carbon atoms, x and y are the same or different and are an integer from 1 to 4 inclusive and n is an integer from 4 to 30 inclusive.

According to a further aspect of the invention, a photopolymerisable element comprises the substrate defined above and a photopolymerisable layer superimposed in interfacial contact upon the adhesive layer of the substrate.

The invention also relates to relief printing plates derived from the photopolymerisable element according to the invention and comprising a relief printing pattern formed in the photopolymerisable layer.

The lower alkyl groups $R_1$ and $R_2$ of the unsaturated resin structure are preferably selected from methyl or ethyl and also are preferably the same. It is especially preferred that both $R_1$ and $R_2$ are methyl groups.

The integers x and y of the resin structure are preferably 2 or 3 and are preferably both either 2 or 3. Most preferably x and y are both equal to 3.

The integer n is preferably from 8 to 12 inclusive.

It will be appreciated that the unsaturated resins may be derived from maleic or fumaric acid although it is preferred that the resin should be a fumarate condensate.

The preferred unsaturated resin is a propoxylated bisphenol A-fumarate condensate.

The unsaturated resin preferably has a molecular weight in the range 2000–10,000 and most preferably 3000–4000.

If desired, a photopolymerisation initiator or a mixture of initiators may be included in the adhesive layer, preferably in an amount 0.01 to 10% by weight based upon the weight of the unsaturated resin, to enhance the adhesion between the adhesive layer of the substrate and the photopolymerisable layer applied thereto in the production of the photopolymerisable element, e.g. as described in British patent specification No. 1,321,108. Photopolymerisation initiators suitable for inclusion in the adhesive layer may be chosen from benzoin, benzoin isopropyl ether, benzoin isobutyl ether, benzoin methyl ether, benzoin ethyl ether, α-methyl benzoin, benzil, anthraquinone, diacetyl anthraquinone, 1-chloroanthraquinone, 9,10-phenanthraquinone, diphenyl disulphide, 2-naphthalenesulphonyl chloride, ω-bromoacetophenone, eosin, thionin, and benzophenone.

Photoinitiator mixtures suitable for inclusion in the adhesive layer may comprise an admixture of:

(i) a compound having the formula:

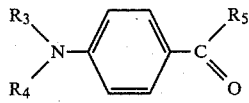

wherein $R_3$ and $R_4$ are the same or different and are selected from hydrogen, or a lower alkyl group having up to 6 carbon atoms and $R_5$ is the same as or different from $R_3$ or $R_4$ and is selected from hydrogen, a lower alkyl group having up to 6 carbon atoms, a partially or completely halogenated alkyl group having up to 6 carbon atoms or a group of the formula:

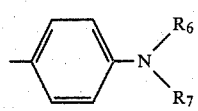

in which $R_6$ and $R_7$ are the same or different and are selected from the same substituents as $R_3$ and $R_4$, said compound being present in an amount 0.01 to 2.0% by weight based upon the weight of the unsaturated resin; and (ii) another photopolymerisation initiator preferably chosen from those listed above, present in an amount 0.1 to 7% by weight based upon the weight of the unsaturated resin.

$R_3$ and $R_4$ of compound (i) are preferably lower alkyl groups having up to 6 carbon atoms and most preferably both are methyl groups. $R_5$ is preferably hydrogen, $CF_3$ or:

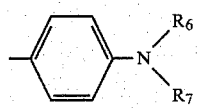

in which $R_6$ and $R_7$ are lower alkyl groups having up to 6 carbon atoms and most preferably both are methyl groups. Compound (i) may be:

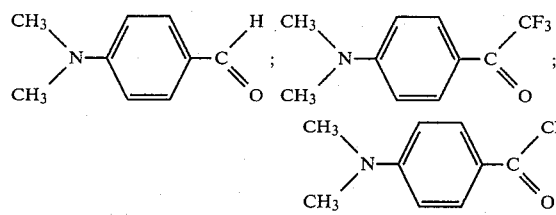

or most preferably 4,4'-bis(dimethylamino)-benzophenone, i.e.

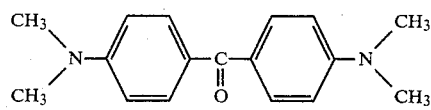

The amount of the photopolymerisation initiator (i), especially 4,4'-bis(dimethylamino)-benzophenone, in such an admixture is in the range 0.01 to 1.0% and preferably 0.01 to 0.5% by weight based upon the weight of the resin.

The photopolymerisation initiator (ii) is preferably present in the admixture in an amount in the range 0.25 to 5.0% by weight based upon the weight of the resin.

A preferred photopolymerisation initiator mixture for use in the adhesive layer of the invention includes isopropyl benzoin ether and 4,4'-bis(dimethylamino)-benzophenone. Such an admixture is particularly effective when it includes about 5.0% by weight of isopropyl benzoin ether and about 0.25% by weight of the 4,4'-bis(dimethylamino)-benzophenone, both amounts being based upon the weight of the resin.

The adhesive layer may include up to 10% by weight based upon the weight of the resin of one or more inert particulate materials to improve such properties as slip and resistance to blocking which are important for the general handling and reeling properties of the film substrates to which the adhesive layer is applied. Suitable particulate materials include inorganic particles such as particles of silica and alumina hydrate having an average particle size in the range 0.1 to 30 μm.

The adhesive layer is preferably applied to the surface of the film or sheet as a solution in an organic solvent such as a ketone, a chlorinated hydrocarbon, or an alcohol, e.g. acetone, methyl ethyl ketone, methylene chloride or methanol, by any suitable known coating technique. After application from such a solution, the adhesive layer is preferably dried to a dry coating thickness of from 0.1 to 15 μm, and most preferably from 0.2 to 8 μm. Thicknesses less than 0.1 μm provide poor adhesion to the film whilst thicknesses exceeding 15 μm may incur cohesive failure within the adhesive layer.

The self-supporting plastics film or sheet may consist of any suitable plastics material such as films or sheets of cellulose esters, e.g. cellulose acetate, polystyrene, polyamides, polymers and copolymers of vinyl chloride, polycarbonate polymers and copolymers of olefines, e.g. polypropylene, polysulphones and linear polyesters which may be obtained by condensing one or more dicarboxylic acids or their lower alkyl diesters, e.g. terephthalic acid, isophthalic, phthalic, 2,5-, 2,6- and 2,7-naphthalene dicarboxylic acid, succinic acid, sebacic acid, adipic acid, azelaic acid, diphenyl dicarboxylic acid, and hexahydroterephthalic acid or bis-p-carboxyl phenoxy ethane, optionally with a mono-carboxylic acid, such as pivalic acid, with one or more glycols, e.g. ethylene glycol, 1,3-propanediol, 1,4-butanediol, neopentyl glycol and 1,4-cyclohexane-dimethanol. Biaxially oriented and heat-set films of polyethylene terephthalate are particularly useful for the production of the film supports according to this invention and may be produced by any of the processes known in the art, e.g. as described in British patent specification No. 838,708.

The surface of polyester film supports may be subjected to an adhesion-promoting pretreatment prior to coating with the adhesive layer. The pretreatment may preferably involve subjecting the film surface to the action of a material having a swelling or solvent action upon the film, e.g. a solution in a common organic solvent such as acetone or methanol of 0.5 to 20% by weight of p-chloro-m-cresol, 2,4-dichlorophenol, 2,4,6- or 2,4,5- trichlorophenol or 4-chlororesorcinol or a mixture of such materials in a common organic solvent. If desired, the pretreating solution may also include an adhesion-promoting resin such as a partially hydrolysed or unhydrolysed copolymer of vinyl chloride-vinyl acetate. After such a solution has been applied to the film surface it is dried at an elevated temperature for a few minutes before applying the adhesive composition.

Alternatively, the pretreatment step may be omitted and the material having the swelling or solvent action on the polyester film may be included in the adhesive composition, the amount of the swelling or solvent component comprising approximately 5 parts by weight to one part by weight of the copolymer component.

The photopolymerisable element may be produced by the printing plate manufacturer by casting a liquid photopolymerisable layer upon the adhesive layer which has already been applied to the film or sheet. Alternatively, the production of the printing plates may commence with a photopolymerisable element as defined above, i.e. an element comprising the film or sheet, the adhesive layer and the photopolymerisable layer.

The photopolymerisable layer may comprise an organic unsaturated material which is capable of being polymerised in the presence of a photopolymerisation initiator upon exposure to active radiation generally in the wavelength range 2000 to 8000 Angstroms and a suitable photopolymerisation initiator. The photopolymerisable organic unsaturated material may include an ethylenically unsaturated addition polymerisable monomer and/or an unsaturated polymer. Suitable ethylenically unsaturated addition polymerisable monomers, as described in British patent specification No. 1,321,108, include styrene, chlorostyrene, vinyltoluene, diallylphthalate, diallylisophthalate, triallylcyanurate, N,N'-methylenebisacrylamide, N,N'-hexamethylenebisacrylamide, stearyl acrylate, acrylamide, methacrylamide, N-hydroxyethylacrylamide, N-hydroxymethacrylamide, α-acetamido-acrylamide, acrylic acid, methacrylic acid, α-chloroacrylic acid, p-carboxystyrene, 2,5-dihydroxystyrene, methyl acrylate, methyl methacrylate, n-butyl acrylate, isobutyl acrylate, ethylene glycol diacrylate, ethylene glycol dimethacrylate, diethylene glycol diacrylate, diethylene glycol dimethacrylate, triethylene glycol diacrylate, triethylene glycol dimethacrylate, trimethylene glycol diacrylate, trimethylene glycol dimethacrylate, tetraethylene glycol diacrylate and tetraethylene glycol dimethacrylate.

Suitable unsaturated polymers include unsaturated polyesters and unsaturated polyurethanes. Such unsaturated polyesters may be obtained by reacting diols such as ethylene glycol, diethylene glycol, triethylene glycol, tetraethylene glycol, polyoxyethylene glycol of the formula:

$$HO-(CH_2-CH_2-O)_n-H$$

wherein n is an integer of 5 to 50, propylene glycol, dipropylene glycol, polyoxypropylene glycols of the formula:

$$HO-(CH_2-CH-O)_m-H$$
$$\phantom{HO-(CH_2-}CH_3$$

wherein m is an integer of 3 to 30, polyoxybutylene glycols of the formula:
$$HO(CH_2-CH_2-CH_2-CH_2-O)_x-H$$

wherein x is an integer of 2 to 30 and copolyglycols comprising $-(CH_2-CH_2-O)_a-$ groups and $-(CH_2-CH-O)_b-$ groups, wherein a and b, which may be the same or different, are integers from 2 to 50, with unsaturated dicarboxylic acids such as maleic acid, fumaric acid, itaconic acid, mesaconic acid, glutaconic acid, or the esters or the anhydrides thereof, for example, the dimethyl or diethyl esters or maleic anhydride.

Such unsaturated polyurethanes may be obtained by reacting unsaturated polyesters having terminal hydroxyl groups with polyisocyanates such as tolylene di-isocyanate and diphenylmethane di-isocyanate. The unsaturated polyesters having terminal hydroxyl groups are produced by the polycondensation reaction of the above-mentioned unsaturated dicarboxylic acids and excess diols mentioned above.

A photopolymerisation initiator is preferably included in the photopolymerisable layer and may consist of one or more of those initiators listed above as being suitable for inclusion in the adhesive layer. The amount of such photopolymerisation initiator used in the photopolymerisable material is preferably in the range of from 0.001 to 10% by weight based upon the total weight of the photopolymerisable composition. If desired, a photopolymerisation initiator having the structure of the initiator (i) of the adhesive layer may optionally be included in the photopolymerisable layer.

Known stabilisers may be employed for the purpose of maintaining storage stability (shelf life) of the photopolymerisable material. Exemplary stabilisers include hydroquinone, mono-tert-butyl hydroquinone, benzoquinone, 2,5-diphenyl-p-benzoquinone, pyridine, phenothiazine, p-diaminobenzene, -naphthol, naphthylamine, pyrogallol, cuprous chloride and nitrobenzene. These stabilisers are added only for completely preventing polymerisation reaction in the absence of actinic radiation such as that used in the production of printing plates. The amount of the stabilisers may preferably be about 0.005 to 3.0% by weight of the total weight of the photopolymerisable composition.

Fillers or binders may also be included in the photopolymerisable layer. Examples of suitable binders include cellulose esters such as acetyl cellulose, cellulose acetate, hydrogen succinate, nitrocellulose, cellulose acetate propionate and cellulose butyrate, polyvinylalcohol derivatives such as polyvinylbutyral, polyamide such as poly-ε-caprolactam, polyhexamethylene sebacamide, copoly(ε-caprolactamhexamethylene sebacamide and/or adipamide), and of suitable fillers include glass, mica, potter's clay, silica, asbestos, magnesium silicate, magnesium carbonate, alumina and polyethylene terephthalate in powder form.

The photopolymerisable layer may be photopolymerised by actinic radiation having wavelengths generally between 2000 and 8000 Angstroms. Practical sources of such actinic radiation include carbon arc lamps, super high pressure mercury lamps, high pressure mercury lamps, low pressure mercury lamps, UV fluorescent lamps, xenon lamps and sunlight.

In one preferred embodiment of the invention, relief printing plates are produced from the photopolymerisable elements by a process which involves exposing the element to actinic light from each side of the element in sequence. The self-supporting plastics film or sheet for use in such an element should be transparent to the wavelength of light employed for the photopolymerisation.

The photopolymerised layers are retained with excellent adhesion to the film or sheet via the adhesive layer and exhibit a remarkably sharp definition and excellent removal of the uncured regions of the photopolymerisable layer.

The configuration of a substrate and photopolymerisable element according to the invention is described below with reference to the accompanying drawings together with the production of a photorelief printing plate from the element.

In the drawings:

BRIEF DESCRIPTION OF THE DRAWING

FIG. 1 is a cross-sectional view of a substrate comprising a thermoplastics film and an adhesive layer;

FIG. 2 is a cross-sectional view of the substrate shown in FIG. 1 assembled with a photopolymerisable layer and positioned for exposure to light through a master;

DETAILED DESCRIPTION OF THE DRAWING

Figure 3:
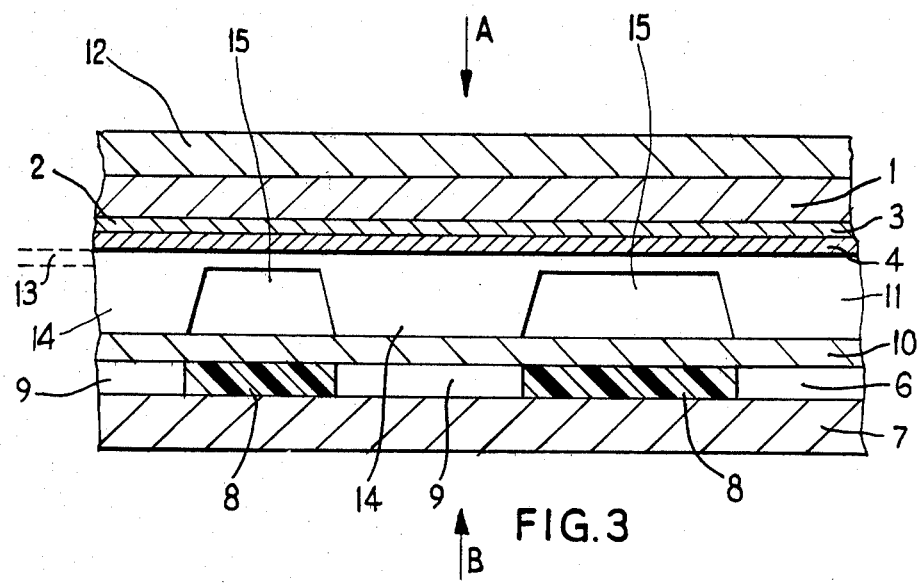
FIG. 3 illustrates the effect of exposing to light the assembly shown in FIG. 2.

FIG. 1 shows a conventional transparent biaxially oriented and heat-set polyethylene terephthalate film 1 whose surface 2 has been pretreated by coating with a solution consisting of 5.0 g p-chloro-m-cresol, 1.0 g partially hydrolysed copolymer of vinyl chloride and vinyl acetate (available commercially as 'Vinylite' VAGH) in 100 ml of acetone to provide a wet coat weight of 100 mg/dm² and drying for 2 minutes at 90° C., the dried layer being shown by the reference numeral 3 in FIG. 1. An adhesive layer 4 was produced by coating an adhesive composition onto the pretreatment layer 3. The applied adhesive composition was dried by heating for 2 minutes at 100° C. to a dry adhesive layer 4.

The substrate shown in FIG. 1 may be employed in the production of a photopolymerisable element and a photorelief plate as illustrated in FIGS. 2 and 3. The sequence of production involves locating a master 6 upon a supporting glass plate 7. The master 6 comprises a conventional photographic negative image of the pattern which is to be deposited on the film base material and has non-radiation transmitting regions 8 of deposited silver and transmitting regions 9. For simplicity of illustration, the film support and substratum layers of the master are not shown in the drawings. A protective radiation-transmitting thermoplastics film 10 was placed over the master 6. A layer 11 of photopolymerisable material was applied over the protective film 10 by pouring and spreading to a uniform thickness. The film base as illustrated in FIG. 1 was then positioned over the layer 11 with the adhesive layer 4 in contact with the photopolymerisable material. The photopolymerisable material is curable by ultra-violet light. A glass plate 12 was then located over the film base material.

A short exposure, say of about 12 seconds, to ultra-violet light from above the film base material and in the direction of the arrow A was applied to bond the layer 11 to the adhesive layer 4 and to cure and harden a base layer 13 (see FIG. 3) of the photopolymerisable material as a foundation for the photorelief pattern. A longer exposure, of about 60 seconds duration, to ultra-violet light was next applied through the master 6 in the direction of the arrow B to cure and harden image regions 14 of the photopolymerisable material corresponding to the transmitting regions 9 of the master 6.

Figure 4:
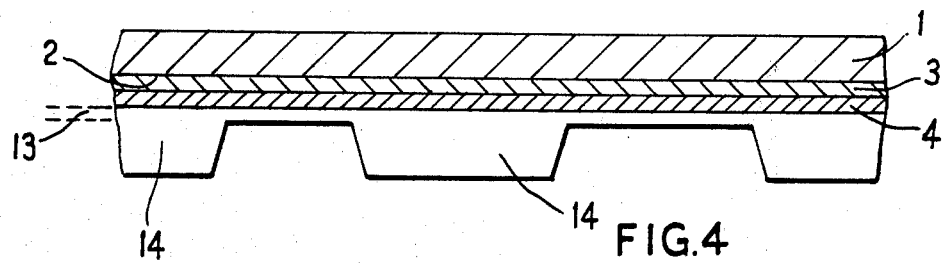
FIG. 4 is a cross-sectional view of the completed printing plate.

Finally, the film assembly was separated from the master 6 and the glass plate 7 and the protective film 10 was peeled from the photopolymerisable layer 11. The assembly was then washed in a solvent, such as a solution of borax, for the photopolymerisable material to remove those uncured regions 15 corresponding to the non-transmitting regions 8 of the master 6. The completed printing plate is illustrated in FIG. 4 and has printing relief regions 14. The overall thickness of the base layer 13 and the relief regions 14 was about 500 μm.

The relief patterns of the printing plates according to this invention have tenacious adhesion to the film base material such that they resist repeated use in rotary printing machines without damage. Furthermore, half-tone detail and images of sharp line definition can be deposited with strong adhesion. The printing plates are therefore suitable for use in continuous letterpress and flexographic printing machines and may, for example, be used for the printing of newspapers, journals, business forms and other printing applications.

The invention is further illustrated by the following examples.

EXAMPLES 1 TO 3

Substrates having the structure described with reference to FIG. 1 were prepared by applying an adhesive layer 4 to the pretreatment layer 3 comprising a partially hydrolysed copolymer of vinyl chloride and vinyl acetate, the transparent polyethylene terephthalate film having a thickness of 100 μm. The unsaturated resin used in the formation of the adhesive layer in each of Examples 1 to 3 was a propoxylated bisphenol A-fumarate resin having a molecular weight in the range 3000-4000 (commercially available as 'Atlac' 33-05 from Atlas Chemical Industries, NV) and was applied as a solution in methyl ethyl ketone to provide dried adhesive layers having the thicknesses shown in the Table. No photopolymerisation initiator or particulate additive was included in the coating composition for the adhesive layer.

The photopolymerisable layer 11 comprised a Hercules Photopolymer Resin FA140 (commercially available from Hercules Inc). Excellent images having sharp definition were formed in the photopolymerisable layer 11 by the image-forming operations described with reference to FIGS. 2, 3 and 4.

The adhesion of the photopolymerised layer 11 to the substrate was found to be excellent and sufficient to withstand repeated use in a printing machine. Adhesion was assessed by subjecting the photopolymerisable layer 11 to a uniform light exposure over its whole area in the direction of the arrow B, i.e. omitting the master 6, and by subjecting the assembly to a 180° peel test at the photopolymerised layer/adhesive layer interface at a peel rate of 10 cm/minute at 20° C. and 60% relative humidity. To facilitate the separation of a small area between the photopolymerised layer and the adhesive layer as a grip for the peel test the layers were separated over that area by a non-adherent film during the application of the photopolymerisable layer 11. The peel strengths are shown in the Table.

TABLE

| Example | Thickness of adhesive layer μm | Peel strength at photopolymerised layer/adhesive layer interface g/cm |
|---------|-------------------------------|----------------------------------------------------------------------|
| 1 | 0.28 | 408 |
| 2 | 0.56 | 433 |
| 3 | 1.20 | 429 |

I claim:

1. A substrate suitable for the production of a photopolymerisable element, comprises a self-supporting plastic film or plastic sheet having an adhesive layer superimposed upon at least one surface thereof, wherein the adhesive layer comprises an adhesive component consisting essentially of an unsaturated resin having the formula:

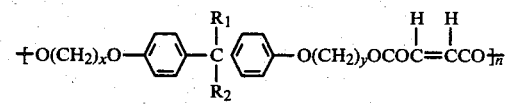

wherein $R_1$ and $R_2$ are the same or different and represent lower alkyl groups having up to 6 carbon atoms, x and y are the same or different and are an integer from 1 to 4 inclusive and n is an integer from 4 to 30 inclusive.

2. A substrate according to claim 1, in which the lower alkyl groups $R_1$ and $R_2$ of the unsaturated resin are methyl or ethyl.

3. A substrate according to claim 1, in which the integers x and y of the unsaturated resin are 2 or 3.

4. A substrate according to claim 1, in which the integer n is from 8 to 12 inclusive.

5. A substrate according to claim 1, in which the unsaturated resin is a propoxylated bisphenol A fumarate condensate.

6. A substrate according to claim 1, in which a photopolymerisation initiator is included in the adhesive layer.

7. A substrate according to claim 1, in which the self-supporting plastics film is a biaxially oriented and heat-set film of polyethylene terephthalate.

8. A photopolymerisable element which comprises a substrate according to claim 1 and a photopolymerisable layer superimposed in interfacial contact upon the adhesive layer of the substrate.

* * * * *